United States Patent
Raad et al.

(10) Patent No.: US 9,236,112 B1
(45) Date of Patent: Jan. 12, 2016

(54) APPARATUSES AND METHODS FOR REDUCING CYCLE TIMES IN SUCCESSIVE MEMORY ACCESSES

(71) Applicant: MICRON TECHNOLOGY, INC., Boise, ID (US)

(72) Inventors: George B. Raad, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/485,293

(22) Filed: Sep. 12, 2014

(51) Int. Cl.
*G11C 7/00* (2006.01)
*G11C 11/4094* (2006.01)

(52) U.S. Cl.
CPC .................. *G11C 11/4094* (2013.01)

(58) Field of Classification Search
USPC ................ 365/203, 189.04, 230.03
See application file for complete search history.

(56) References Cited

U.S. PATENT DOCUMENTS

| | | | |
|---|---|---|---|
| 7,355,881 B1 * | 4/2008 | Dankert | G11C 7/1057 365/154 |
| 2006/0280003 A1 * | 12/2006 | Kolla | G11C 7/22 365/189.08 |

* cited by examiner

*Primary Examiner* — Vu Le
(74) *Attorney, Agent, or Firm* — Dorsey & Whitney LLP (57) ABSTRACT

Methods and apparatuses are disclosed including an apparatus that includes a controller circuit configured to access a first subarray of a memory and to access a second subarray of the memory subsequent to accessing the first subarray but contemporaneous with precharging a portion of the first subarray by a precharge circuit associated with the first subarray.

33 Claims, 4 Drawing Sheets

APPARATUSES AND METHODS FOR REDUCING CYCLE TIMES IN SUCCESSIVE MEMORY ACCESSES

BACKGROUND OF THE INVENTION

In dynamic random-access memory (DRAM), the row cycle time (tRC) is the sum of the row active time (tRAS) and the row precharge time (tRP). The row cycle time generally defines the minimum time between successive activate commands to a portion of the memory, such as a bank. The row precharge component of the row cycle time represents a period of time during which digit lines for the portion of the memory are precharged to a certain voltage in order to allow a subsequent memory access to that portion of the memory. Once the digit lines are precharged, a word line activate signal is provided to the memory, which allows charge sharing and, subsequently, data sensing and restoring (which together generally represent the low active time). After the data sensing and restoring, the digit lines must be precharged again before the next word line activate signal can be provided to the memory bank.

One method to reduce the row precharge time and the overall row cycle time is to add more array circuitry (such as additional sense amplifiers and precharge circuits) so that the memory is partitioned into smaller portions. This additional array circuitry, however, reduces the amount of area available for memory storage and can also increase power consumption.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
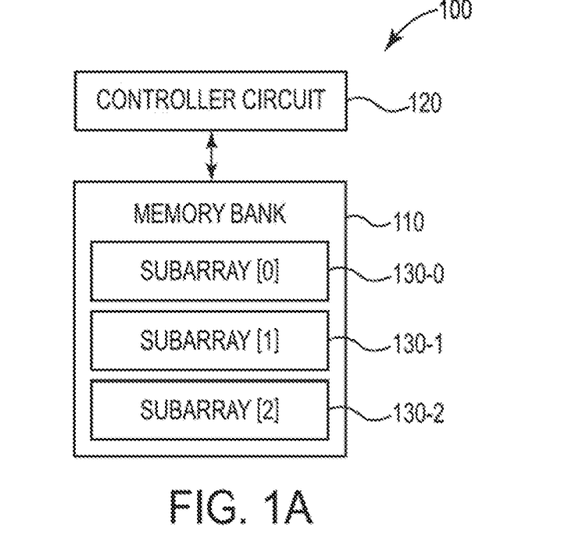
FIG. 1A is a block diagram of an apparatus with a memory bank including a controller circuit for reducing row cycle times in successive memory accesses, according to an embodiment of the present invention.

FIG. 1A illustrates an apparatus 100 including a memory bank 110 and a controller circuit 120 according to an embodiment of the invention. As used herein, apparatus may refer to, for example, an integrated circuit, a memory device, a memory system, an electronic device or system, a smart phone, a tablet, a computer, a server, etc. The memory bank 110 in FIG. 1A includes a plurality of subarrays 130-0, 130-1, 130-2. The controller circuit 120 may be physically separate and external to the memory bank 110, for example, a memory controller coupled to a memory including the memory bank 110. It will be appreciated, however, that in some embodiments of the present disclosure, the controller circuit 120 may be integral with a memory bank 110, as in FIG. 1A.

The controller circuit 120 accesses respective ones of the plurality of subarrays 130-0, 130-1, 130-2 by providing control and/or data signals to and receiving responses and/or data from the plurality of subarrays 130-0, 130-1, 130-2. In some embodiments, the memory bank 110 also includes a plurality of precharge circuits and sense amplifiers (not shown in FIG. 1A), together with other array circuitry and input/output nodes for coupling to other components of the apparatus 100. Each subarray includes its own set of digit and word lines, to which memory cells (e.g., DRAM cells) may be coupled. In some embodiments, the memory bank 110 may include a single set of input/output nodes coupled to digit lines for each of the plurality of subarrays 130-0, 130-1, 130-2.

Each of the plurality of subarrays 130-0, 130-1, 130-2 may be uniquely associated with (e.g., include) its own precharge circuit, sense amplifier circuit, and so forth, or these circuits may be shared among two or more of the plurality of subarrays 130-0, 130-1, 130-2. For example, one embodiment includes a precharge circuit adjacent each respective subarray so that the digit lines in each respective subarray may be charged by multiple adjacent precharge circuits. As another example, a precharge circuit may be positioned between the first subarray 130-0 and the second subarray 130-1, thus allowing the first and second subarrays 130-0, 130-1 to share the precharge circuit. In other embodiments, though, each subarray may have its own precharge circuit that is not shared with other subarrays. In any event, each precharge circuit may only be able to precharge the digit lines for subarrays to which it is coupled, and different precharge circuits may be physically separate from other precharge circuits. So, for instance, if a first precharge circuit is coupled to the first subarray 130-0, but not to the second subarray 130-1, the first precharge circuit may be unable to precharge digit lines in the second subarray 130-1. Similarly, if as second precharge circuit is coupled to the second subarray 130-1, but not to the first subway 130-0, the second precharge circuit may be unable to precharge digit lines in the first subarray 130-0.

The controller circuit 120 may be configured to access (e.g., read, write, etc.) the first subarray 130-0 of the memory bank 110, and also to access the second subarray 130-1 of the memory bank 110 subsequent to accessing the first subarray 130-0, but contemporaneous with precharging a portion (e.g., one or more digit lines) of the first subarray 130-0. For example, at least a portion of the precharging of the first subarray 130-0 occurs contemporaneously with the accessing of the second subarray 130-1. In some embodiments, the row active time of the access to the second subarray 130-1 may overlap the row precharge time of the first subarray 130-0. In some embodiments, the access to memory cells of the second subarray 130-1 is provided prior to completion of precharging digit lines of the first subarray 130-0. Following the access to the first subarray 130-0, one or more digit lines of the first subarray 130-0 may need to be precharged to a precharge voltage level before a subsequent access to the first subarray 130-0 can be effectuated by the controller circuit 120. Accordingly, a first precharge circuit that is associated with the first subarray 130-0 may begin to recharge the first subarray 130-0 by, for example, biasing the voltage on the digit lines towards the precharge voltage level.

The controller circuit 120 may be able to access the second subarray 130-1 of the memory bank 110 contemporaneous with precharging the digit lines of the first subarray 130-0 (following an access to the first subarray 130-0) if an address restriction—such as a row address restriction—is satisfied for successive accesses to the memory bank 110. For example, if access N is to the first subarray 130-0, and the next access N+1 is to the second subarray 130-1, then the access N+1 to the second subarray 130-1 can proceed as long as the digit lines in the second subarray 130-1 have already been precharged, without the need to wait until the digit lines in the first subarray 130-0 have been precharged following the access to the first subarray 130-0. As a result if the address restriction is satisfied when address information associated with successive accesses is received, the row cycle time tRC may be shorter (tRC-SHORT) than if the address restriction is not satisfied (tRC-LONG). The longer time for the row cycle time tRC-LONG if the address restriction is not satisfied may be due to the need to precharge the digit lines in the subarray in which subsequent (e.g., back-to-back) accesses are being requested. Thus, a shorter cycle time (tRC-SHORT) or a longer cycle time (tRC-LONG) may be dependent on whether the address restriction is satisfied for successive accesses.

Still referring to FIG. 1A, the controller circuit 120 may be able to detect which row cycle time (i.e., tRC-LONG or tRC-SHORT) is observed based on the physical location of successive accesses to the memory subarrays 130-0, 130-1, 130-2. For example, the shorter row cycle time tRC-SHORT may be used if the first access N is to the first subarray 130-0 and the second access N+1 is to the third subarray 130-2. However, if the first access N and the second access N+1 are both to the first subarray 130-1, or, if the first access N is to the first subarray 130-1, the second access N+1 is to the second subarray 130-2, and the first and second subarrays 130-1, 130-2 share precharge circuitry and/or digit lines, the longer row cycle time tRC-LONG may be needed. It will be appreciated that the controller circuit 120 may access the plurality of subarrays 130-0, 130-1, 130-2 in a manner that takes advantage of the shorter row cycle times tRC-SHORT—for example, the controller may store contiguous data in physically separate subarrays 130-0, 130-1, 130-2, as described in more detail below with reference to FIG. 3.

In some embodiments, the controller circuit 120 may be configured to access the second subarray 130-1 subsequent to the completion of the access to the first subarray 130-0—i.e., the controller circuit 120 may wait until the access to the first subarray 130-0 is complete before requesting access to the second subarray 130-1. In other embodiments, however, the controller circuit 120 may begin to access the second subarray 130-1 prior to the completion of the access to the first subarray 130-0—for example, the controller circuit 120 may send an access request (e.g., a read or a write) to the second subarray 130-1 while the access to the first subarray 130-0 is finishing in order to have less downtime between successive accesses to the memory bank 110.

Also, in some embodiments, the controller circuit 120 may be configured to access the second subarray 130-1 of the memory bank 110 before the precharging of the portion of the first subarray 130-0 begins, and/or the controller may be configured to access the second subarray 130-1 of the memory bank 110 after the precharging of the portion of the first subarray 130-0 begins but before the precharging is completed. Also, while in some embodiments the controller circuit 120 may provide an instruction to the first subarray 130-0 to precharge the portion (e.g., the digit lines) of the first subarray 130-0, in other embodiments, the first precharge circuit may precharge the portion of the first subarray 130-0 following the initial access without any intervening instructions from the memory controller.

Figure 1B:
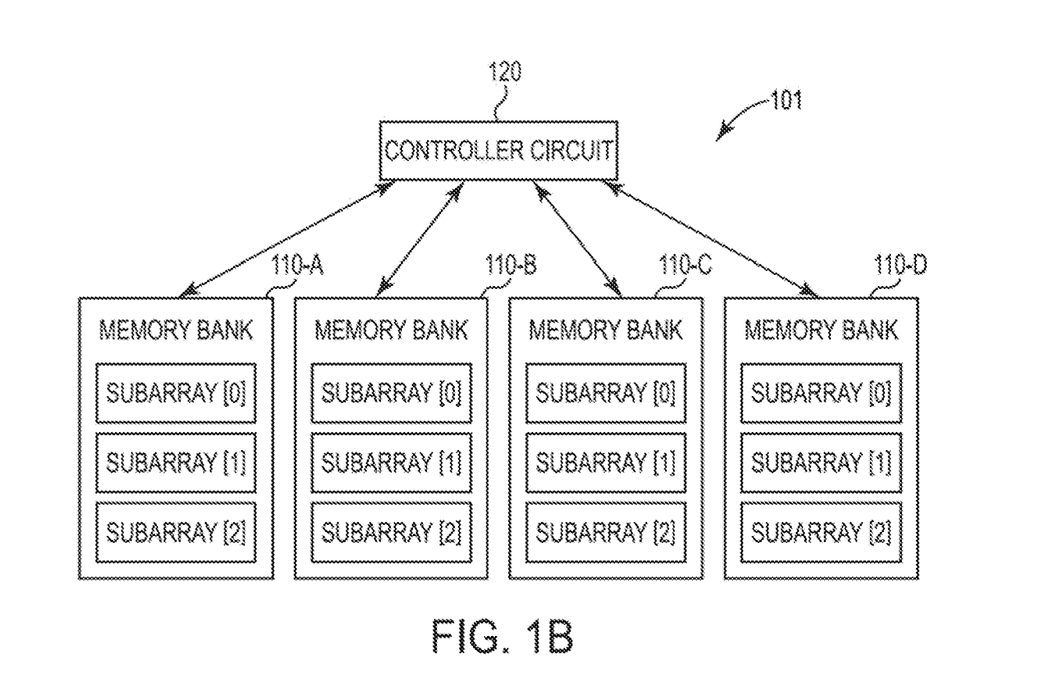
FIG. 1B is a block diagram of an apparatus with a controller circuit and a plurality of memory banks according to an embodiment of the invention.

FIG. 1B illustrates an apparatus 101, similar to the apparatus 100 illustrated in FIG. 1A, that includes a plurality of memory banks 110-A, 110-B, 110-C, 110-D, with the controller circuit 120 being external to but coupled with each of the plurality of memory banks 110-A, 110-B, 110-C, 110-D. Accordingly, it will be appreciated that while in some embodiments of the present disclosure, the controller circuit 120 may be integral with a memory bank 110, as in FIG. 1A, in other embodiments, the controller circuit 120 may be physically separate from and external to the memory banks 110-A, 110-B, 110-C, 110-D, but still control one or more of the memory banks 110-A, 110-B, 110-C, 110-D.

Figure 2A:
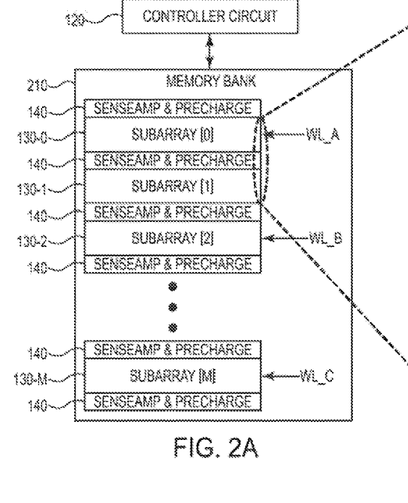
FIG. 2A is a block diagram of an embodiment of the memory bank illustrated in FIG. 1A according to an embodiment of the invention.
Figure 2B:
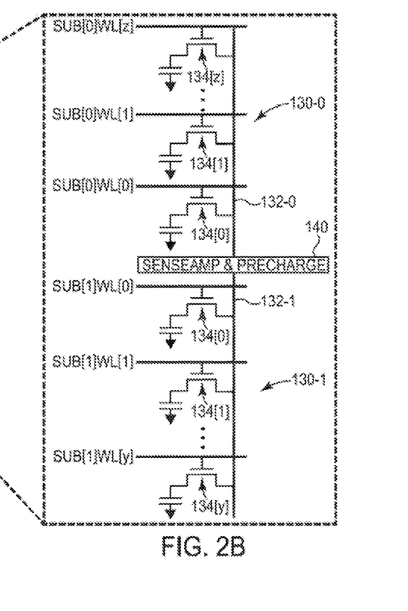
FIG. 2B is an enlarged, simplified schematic diagram of a portion of the memory bank illustrated in FIG. 2A according to an embodiment of the invention.

Turning now to FIGS. 2A and 2B, a more detailed view of one embodiment of a memory bank 210 is shown and described. The memory bank 210 illustrated in FIG. 2A is similar to the memory bank 110 illustrated in FIG. 1A in that it is coupled to a controller circuit 120 and includes a plurality of subarrays 130-0, 130-1, 130-2, . . . 130-M. Also shown in FIG. 2A are array circuitry 140, such as sense amplifier circuits and precharge circuits.

FIG. 2B is an enlarged schematic view of a portion of the memory bank 210 illustrated in FIG. 2A. In FIG. 2B, a digit line 132-0 of the first subarray 130-0 is shown coupled to a plurality of word lines SUB[0]WL[0], SUB[0]WL[1], . . . SUB[0]WL[Z]. Each word line, when activated, couples a respective DRAM cell (e.g., a capacitor) to the digit line 132-0. FIG. 2B also illustrates a digit line 132-1 of the second subarray 130-1, and array circuitry 140 (e.g., a sense amplifier and precharge circuit) coupled between digit lines 132-0, 132-1. While only one digit line 132-0, 132-1 are illustrated in FIG. 2B for respective subarrays 130-0, 130-1, it will be appreciated that each subarray may have a set (i.e., one or more) of digit line(s) depending on the size of the subarray.

As described above, but with reference now to FIGS. 2A and 2B, the first subarray 130-0 may be configured to provide access to a first set of memory cells 134[0]-[z] in the first subarray 130-0 responsive to a first access command received from the controller circuit 120, and may also be configured to precharge digit lines 132-0 of the first subarray 130-0 following the access to the first set of memory cells. A different subarray, for example the third subarray 130-2 illustrated in FIG. 2A, may be configured to provide access to a second set of memory cells 134 in the different subarray 130-2 responsive to a second access command from the controller circuit 120 and may also be configured to provide access to the second set of memory cells 134[0]-[y] in the different subarray 130-2 prior to completion of the precharging of the digit lines for the first subarray 130-0. Access to the memory cells 134 may be provided by selectively coupling the respective digit lines to charge that is stored on the memory cells 134. In some but not all embodiments, the memory cells 134 may be DRAM cells. The charge stored on a memory cell 134 may be coupled to the respective digit line by activating a respective word line. For example, activating word line SUB[0]WL1 will couple the stored charge of the memory cell 134[1] to the digit line 132-0.

Figure 3:
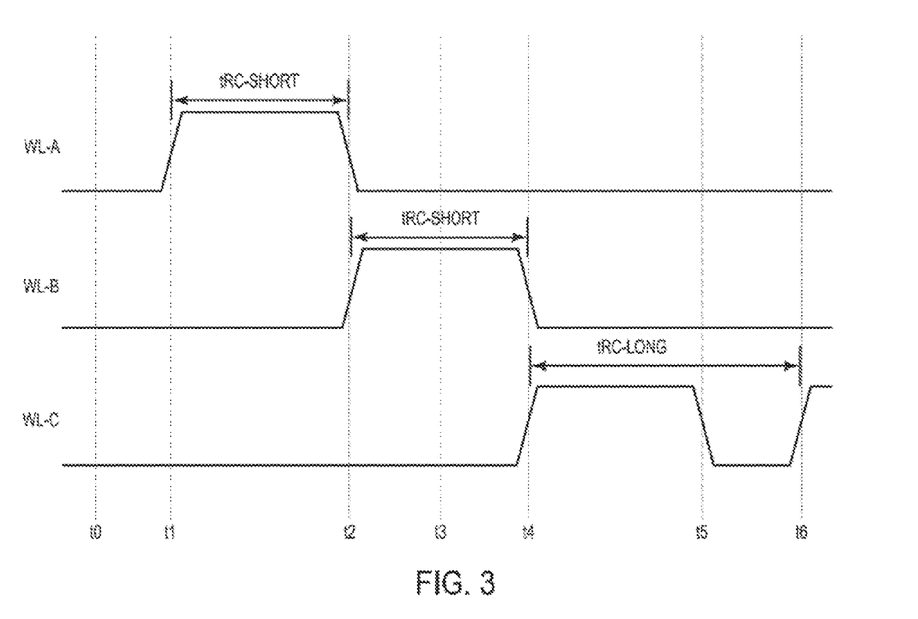
FIG. 3 is a timing diagram illustrating the operation of the memory bank illustrated in FIG. 2A according to an embodiment of the invention.

Turning to FIG. 3, and with reference to the three word lines WL-A, WL-B, WL-C identified in FIG. 2A, the operation of as memory bank 110, 210 in accordance with the present disclosure will now be described. At time t0, digit lines for each of the plurality of subarrays 130-0, 130-1, 130-2, . . . 130-M may be precharged. At time t1, an access request for accessing the first word line WL-A in the first subarray 130-0 may be provided to the memory bank. The access request may be provided in that the signal for the first word line WL-A is provided as logic high, thus activating the first word line WL-A. At time t2, following the first access, the signal for the first word line WL-A may transition to logic low, and the digit line(s) in the first subarray 130-0 may begin to precharge using as first precharge circuit associated with the first subarray 130-0 in order to prepare for a subsequent access to the first subarray 130-0. Prior to completion of the precharging of the digit lines of the first subarray 130-0 (which may be at time t3), however, an access request for accessing another word line WL-B, in a different subarray 130-2, may be provided to the same memory bank. The different subarray 130-2 may not share digit lines and/or a precharge circuit with the first subarray 130-0. The access request for requesting the other word line WL-B may be provided in that the signal for the other word line WL-B is provided as logic high, thus activating the second word line WL-B.

Following the access request for the second word line WL-B, at time t4, another access request may be provided for accessing yet another word line WL-C, and at time t6, still another access request may be provided. The access request provided at time t6, however, is for a word line in the same subarray as the access request provided at time t4. Thus, rather than taking advantage of the shorter row cycle time tRC-SHORT, the access request at time t6 may need to wait until the digit lines in subarray 130-M are precharged, which begins at time t5, before accessing the memory cell in the same subarray 130-M responsive to the access request provided at time t6. The row cycle time for the access request provided at time t4 is shown in FIG. 3 as tRC-LONG, extending between times t4 and t6. The row active time is between times t4 and t5, during which the word line WL-C is provided as logic high, and the row precharge time is between times t5 and t6 during which the word line WL-C is provided as logic low and the digit lines of subarray 130-M are precharged in preparation for a subsequent access request (e.g., the access request provided at time t6). As illustrated by FIG. 3, the row cycle time tRC-LONG is longer than the shorter row cycle time tRC-SHORT, and the time difference between the longer row cycle time tRC-SHORT and the shorter row cycle time tRC-SHORT is generally the row precharge time (e.g., between time t5 and t6). Thus, taking advantage of the shorter row cycle time tRC-SHORT may reduce the row cycle time for successive memory accesses.

With reference back to FIG. 2A, in some embodiments, the controller circuit 120 may advantageously store a first portion of data in the first subarray 130-0. The controller may also store a second portion of data in another subarray 130-2 that is physically distinct from the first subarray 130-0 (e.g., by not sharing digit lines and/or by not sharing precharge or sense amplifier circuitry). The first and second portions of data may be stored in the respective subarrays 130-0, 130-2 in a manner such that access to the second portion of data from the other subarray 130-2 can begin prior to completion of the precharging of the first subarray 130-0 following access to the first portion of data in the first subarray 130-0. The first and second portions of data may be, prior to being separately stored in separate subarrays 130-0, 130-2, consecutive portions of a continuous data stream in some embodiments. Also, even though the physical addresses of the first and second portions of data stored in this embodiment are not contiguous, the logical addresses may be contiguous—for example, the logical address at which the first portion of data is stored (in the first subarray 130-0) may be consecutive to the logical address at which the second portion of data is stored (in the other subarray 130-2).

Figure 4:
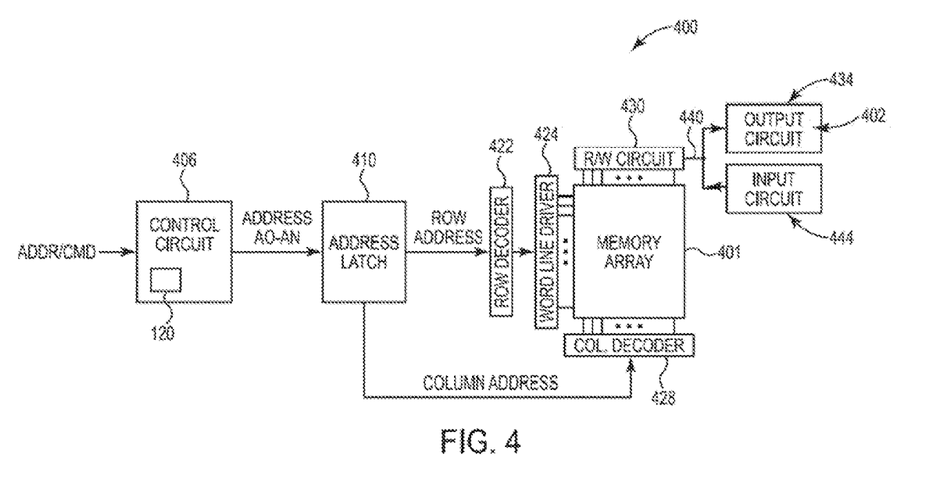
FIG. 4 is a block diagram of a memory according to an embodiment of the invention.

FIG. 4 illustrates a memory 600 according to an embodiment of the present invention. The memory 400 includes an array 401 of memory cells, which may be, for example, volatile memory cells (e.g., DRAM memory cells, SRAM memory cells), non-volatile memory cells (e.g., flash memory cells), or some other types of memory cells. The array 401 of memory cells may in some embodiments be divided into a plurality of banks, such as the memory bank 110 described above with reference to FIG. 1A. The memory 400 includes a control circuit 406 that receives memory commands and addresses through an ADDR/CMD bus. The control circuit 406 provides control signals, based on the commands received through the ADDR/CMD bus. The control circuit 406 may include a controller circuit (e.g., controller circuit 120) configured to access a first subarray of the array 401, and also to access a second subarray of the array 401 subsequent to accessing the first subarray, but contemporaneous with precharging a portion (e.g., one or more digit lines) of the first subarray. The control circuit 406 also provides row and column addresses to the memory 400 through an address bus and an address latch 410. The address latch then outputs separate column addresses and separate row addresses.

The row and column addresses are provided by the address latch 410 to a row address decoder 422 and a column address decoder 428, respectively. The column address decoder 428 selects digit lines extending through the array 401 associated with respective column addresses. The row address decoder 422 is connected to word line driver 424 that activates respective rows of memory cells in the array 401 associated with received row addresses. Selected data lines associated with a received column address are coupled to a read/write circuit 430 to provide read data to a data output circuit 434 via an input-output data bus 440. Write data are provided to the array 401 through a data input circuit 444 and the memory array read/write circuit 430. The read/write circuit 430 may be coupled to circuitry of the array 401, for example, precharge circuits and sense amplifiers, used during access of the array 401. The control circuit 406 responds to memory commands and addresses provided to the ADDR/CMD bus to perform various operations on the array 401. In particular, the control circuit 406 is used to provide internal control signals to read data from and write data to the array 401.

From the foregoing it will be appreciated that, although specific embodiments of the invention have been described herein for purposes of illustration, various modifications may be made without deviating from the spirit and scope of the invention. For example, FIGS. 1A, 1B, 2A, and 2B illustrate embodiments of apparatuses 100, 101, memory banks 110, 210, controller circuits 120, subarrays 130-0, 130-1, 130-2, and so forth. However, other apparatuses, memory banks, controller circuits, subarrays, and so forth may be used, which are not limited to having the same design, and may be of different designs and include circuitry different from the circuitry in the embodiments illustrated in the figures.

Accordingly, the invention is not limited to the specific embodiments of the invention described herein.

What is claimed is:
1. An apparatus, comprising:
a controller circuit configured to access a first subarray of a memory, and to access a second subarray of the memory subsequent to accessing the first subarray but contemporaneous with precharging a portion of the first subarray by a precharge circuit associated with the first subarray.

2. The apparatus of claim 1, wherein the first and second subarrays are in a same memory bank of the memory.

3. The apparatus of claim 1, wherein the memory includes a plurality of memory banks, the controller circuit being separate from and coupled to each of the plurality of memory banks.

4. The apparatus of claim 1, wherein the controller circuit is configured to access the second subarray subsequent to the completion of the access to the first subarray.

5. The apparatus of claim 1, wherein the controller circuit is configured to access the second subarray prior to completion of the access to the first subarray.

6. The apparatus of claim 1, wherein the controller circuit is configured to access the second subarray of the memory before the precharging of the portion of the first subarray begins.

7. The apparatus of claim 1, wherein the controller circuit is configured to access the second subarray of the memory before the precharging of the portion of the first subarray is completed.

8. The apparatus of claim 1, wherein the precharge circuit precharges the portion of the first subarray following the access of the first subarray and during access of the second subarray.

9. The apparatus of claim 1, wherein the controller circuit is configured to control the precharge circuit to precharge the portion of the first subarray.

10. The apparatus of claim 1, wherein the portion of the first subarray comprises a digit line of the first subarray.

11. The apparatus of claim 1, wherein the controller circuit is configured to access the first and second subarrays by providing control signals to array circuitry coupled to the first and second subarrays.

12. An apparatus, comprising:
a first subarray having a first set of digit lines and being configured to provide access to a first set of memory cells responsive to a first access command received from a controller circuit and the first subarray also being configured to precharge the first set of digit lines following the access to the first set of memory cells; and
a second subarray having at second set of digit lines and being configured to provide access to a second set of memory cells responsive to a second access command received from the controller circuit and the second subarray also being configured to provide access to the second set of memory cells, responsive to access commands, prior to completion of the precharging of the first set of digit lines.

13. The apparatus of claim 12, further comprising a same memory bank having input/output nodes coupled to the first and second sets of digit lines, the same memory bank comprising both the first and second subarrays.

14. The apparatus of claim 12, wherein the first subarray is associated with a first set of sense amplifiers and the second subarray is associated with a second set of sense amplifiers different than the first set of sense amplifiers, and the second set of sense amplifiers are configured to sense voltages on the second set of digit lines before the first set of sense amplifiers are ready to sense subsequent voltages following the access to the first set of memory cells.

15. An apparatus, comprising:
a memory, comprising
a first subarray, the first subarray associated with a precharge circuit and set of digit lines; and
second subarray; and
a controller circuit configured to access the first subarray and also to access the second subarray subsequent to accessing the first subarray but contemporaneous with precharging the set of digit lines associated with the first subarray using the precharge circuit.

16. The apparatus of claim 15, wherein the set of digit lines comprises a first set of digit lines, the precharge circuit comprises a first precharge circuit, and the second subarray is associated with a second precharge circuit and a second set of digit lines.

17. The apparatus of claim 16, wherein the first precharge circuit and the second precharge circuit are configured to precharge digit lines of different subarrays.

18. The apparatus of claim 16, wherein the first precharge circuit and the second precharge circuit are not shared by the first subarray and the second subarray.

19. The apparatus of claim 16, wherein the second precharge circuit is physically separate from the first precharge circuit.

20. The apparatus of claim 15, wherein the controller circuit is configured to detect at first or second cycle time to be observed based on the locations of successive accesses to subarrays of the memory, wherein the second cycle time is longer than the first cycle time.

21. The apparatus of claim 15, wherein the controller circuit is configured to store contiguous data in physically separate subarrays of the memory.

22. A method, comprising:
accessing a first subarray of a memory;
precharging a digit line of the first subarray using a first precharge circuit associated with the first subarray following the accessing of the first subarray; and
prior to completion of the precharging of the digit line of the first subarray, accessing a second subarray of the memory, wherein the second subarray is associated with a second precharge circuit separate front the first precharge circuit.

23. The method of claim 22, wherein the first and second subarrays are included in a same memory bank.

24. The method of claim 22, further comprising precharging, prior to accessing the second subarray, the digit line of the second subarray using the second precharge circuit.

25. The method of claim 24, wherein precharging of the digit line of the second subarray using the second precharge circuit is completed prior to accessing of another subarray in the memory.

26. The method of claim 22, further comprising precharging the digit line of the second subarray following the access of the second subarray of the memory.

27. The method of claim 22, wherein accessing the first subarray of the memory comprises providing a read command to the first subarray.

28. The method of claim 22, wherein precharging the digit line of the first subarray comprises setting the digit line of the first subarray to a precharge voltage.

29. The method of claim 28, wherein accessing the first subarray of the memory comprises selectively coupling the digit line of the first subarray to charge stored on a memory cell coupled to the digit lines.

30. A method, comprising:
storing a first portion of data in a first subarray of a memory, the first subarray including an associated first set of digit lines and being associated with a first precharge circuit; and storing a second portion of data in a second subarray of the memory, the second subarray including an associated second set of digit lines and being associated with a second precharge circuit;

wherein the first and second portions of data are stored in the first and second subarrays such that the second portion of data can be accessed from the second subarray prior to completion of a precharging of the first subarray by the first precharge circuit.

31. The method of claim 30, wherein the first and second portions of data are, prior to being separately stored, consecutive portions of a continuous data stream.

32. The method of claim 30, wherein a second logical address at which the second portion of data is stored is consecutive to a first logical address at which the first portion of data is stored.

33. The method of claim 30, further comprising:

storing a third portion of data in a third subarray of the memory, the third subarray including an associated third set of digit lines and being associated with a third precharge circuit; and detect a first or second cycle time to be observed based on the locations of successive accesses to the first and third subarrays of the memory, wherein the second cycle time is longer than the first cycle time.

* * * * *

UNITED STATES PATENT AND TRADEMARK OFFICE
CERTIFICATE OF CORRECTION

PATENT NO. : 9,236,112 B1  
APPLICATION NO. : 14/485293  
DATED : January 12, 2016  
INVENTOR(S) : George B. Raad and Kang-Yong Kim Page 1 of 1

It is certified that error appears in the above-identified patent and that said Letters Patent is hereby corrected as shown below:

|  | Reads | Should Read |
|---|---|---|
| Column 8, Line 1 Claim 15, | "second subarray; and" | --a second subarray; and-- |
| Column 8, Line 22 Claim 20, | "The apparatus of claim 15, wherein the controller circuit is configured to detect at first or second cycle time" | --The apparatus of claim 15, wherein the controller circuit is configured to detect a first or second cycle time-- |
| Column 8, Line 37 Claim 22, | "wherein the second subarray is associated with a second precharge circuit separate front the first precharge circuit." | --wherein the second subarray is associated with a second precharge circuit separate from the first precharge circuit.-- |

Signed and Sealed this  
Twenty-eighth Day of June, 2016

Michelle K. Lee  
*Director of the United States Patent and Trademark Office*